US011803675B1

(12) United States Patent
Brown et al.

(10) Patent No.: US 11,803,675 B1
(45) Date of Patent: *Oct. 31, 2023

(54) VIRTUAL REALITY ENVIRONMENT FOR CATASTROPHE PREPAREDNESS AND RESPONSE EDUCATION

(71) Applicant: United Services Automobile Association (USAA), San Antonio, TX (US)

(72) Inventors: Donna Moncrief Brown, San Antonio, TX (US); Bradly Jay Billman, Celina, TX (US); Alexander B. Nagelberg, San Antonio, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 289 days.

This patent is subject to a terminal disclaimer.

(21) Appl. No.: 17/207,591

(22) Filed: Mar. 19, 2021

Related U.S. Application Data

(63) Continuation of application No. 15/434,842, filed on Feb. 16, 2017, now Pat. No. 10,984,151.
(Continued)

(51) Int. Cl.
G06F 30/20 (2020.01)
G06T 17/05 (2011.01)

(52) U.S. Cl.
CPC ............. G06F 30/20 (2020.01); G06T 17/05 (2013.01)

(58) Field of Classification Search
CPC .......... G06F 30/20; G06F 30/25; G06F 30/27; G06F 30/28; G06T 17/05
See application file for complete search history.

(56) References Cited

U.S. PATENT DOCUMENTS 7,259,656 B1 8/2007 Wright
8,346,578 B1 1/2013 Hopkins, III et al.
(Continued)

OTHER PUBLICATIONS

Sharad Sharma, S., Jerripothula, S., Mackey, S., & Soumare, O. (2014). Immersive virtual reality environment of a subway evacuation on a cloud for disaster preparedness and response training. 2014 IEEE Symposium on Computational Intelligence for Human-like Intelligence (CIHLI) (Year: 2014).*
(Continued)

Primary Examiner — Steven W Crabb
(74) Attorney, Agent, or Firm — Potomac Law Group, PLLC

(57) ABSTRACT

Methods and systems described in this disclosure are directed to rendering audiovisual (A/V) simulation of a disaster situation at a facility by artificially simulating the disaster situation. The disaster situation uses a 3D model of the environment associated with the facility. Embodiments of the disclosed system continuously collect data relating to reactions of one or more users to the simulation model. Upon analyzing the reactions of one or more users to the simulation model, the system provides A/V indicators such as an avatar, a virtual teacher, or a virtual user to provide information for responding to the disaster situation. In some embodiments, the simulation model can be customized based on one or more factors, such as an age of the one or users, a skillset of the one or more users, a geographical location of the facility.

20 Claims, 5 Drawing Sheets

Related U.S. Application Data

(60) Provisional application No. 62/296,893, filed on Feb. 18, 2016.

(56) References Cited

U.S. PATENT DOCUMENTS

| | | |
|---|---|---|
| 9,836,993 B2 | 12/2017 | Dunlop et al. |
| 2005/0190053 A1 | 9/2005 | Dione |
| 2007/0219645 A1 | 9/2007 | Thomas et al. |
| 2009/0018875 A1 | 1/2009 | Monatesti et al. |
| 2009/0191529 A1 | 7/2009 | Mozingo et al. |
| 2015/0170503 A1 | 6/2015 | Wedig et al. |
| 2015/0273323 A1 | 10/2015 | Perry et al. |
| 2016/0005307 A1 | 1/2016 | Deliuliis et al. |
| 2016/0189514 A1 | 6/2016 | Todasco et al. |
| 2016/0292978 A1 | 10/2016 | Lee |

OTHER PUBLICATIONS

Jaziar Radianti et al., "Fire simulation-based adaptation of Smart Rescue App for serious game: Design, setup and user experience," Engineering Applications of Artificial Intelligence 46 (2015) 312-325 (Year: 2015).*

Sturm, Nadine et al., "Simulation as a new approach to First Responders Training," International Conference on Computational Intelligence, Modelling and Simulation, pp. 159-163 (2009) (Year: 2009).

Hsu, Edbert B et al., "State of Virtual Reality Based Disaster Preparedness and Response Training," PLOS Currents Disasters, Apr. 24, 2013, Ed. 1, pp. 1-12 (2013) related to various emergency response simulation systems. (Year: 2013).

* cited by examiner

VIRTUAL REALITY ENVIRONMENT FOR CATASTROPHE PREPAREDNESS AND RESPONSE EDUCATION

CROSS-REFERENCE TO RELATED APPLICATIONS

This application is a continuation of U.S. application Ser. No. 15/434,842, filed Feb. 16, 2017, now allowed, which is a non-provisional of and claims priority to U.S. Provisional Application No. 62/296,893, filed on Feb. 18, 2016, entitled "VIRTUAL REALITY ENVIRONMENT FOR CATASTROPHE PREPAREDNESS AND RESPONSE EDUCATION," which is hereby incorporated by reference in its entirety for all purposes.

TECHNICAL FIELD

Various embodiments of the present disclosure generally relate to creation of a virtual reality environment. More specifically, various embodiments of the present disclosure relate to methods and systems for rendering a virtual reality environment for catastrophe preparedness and response education.

BACKGROUND

Effective education for catastrophe preparedness and response can prevent injuries or death during disasters. Some people feel immune to disasters and fail to take precautions.

BRIEF DESCRIPTION OF THE DRAWINGS

Embodiments of the present disclosure will be described and explained through the use of the accompanying drawings in which.

DETAILED DESCRIPTION

Figure 1:
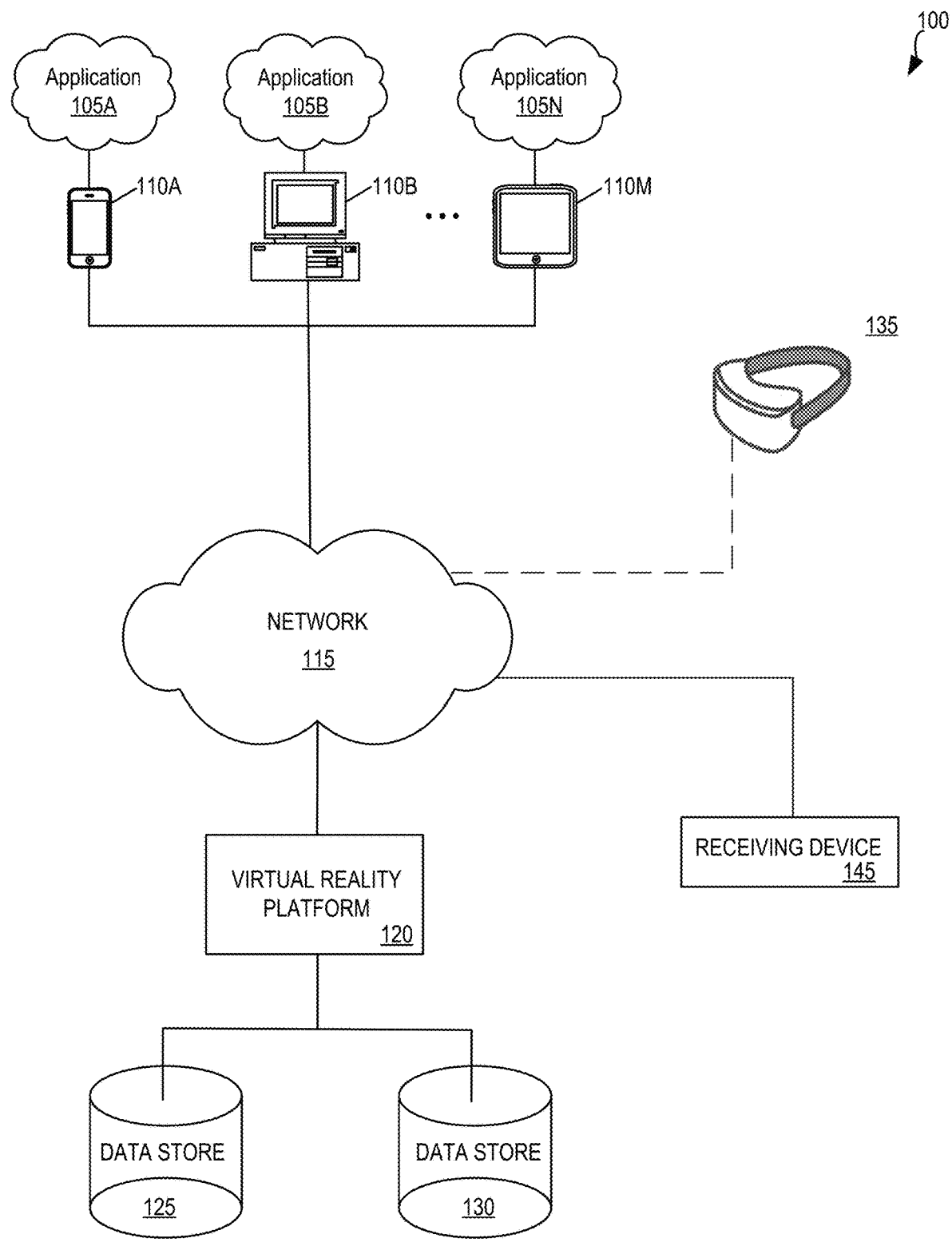
FIG. 1 illustrates an example of a network-based operating environment in accordance with various embodiments of the present disclosure.

Various embodiments of the present disclosure generally relate to creation of virtual reality environment in connection with disaster situations (e.g., caused due to natural and/or human-induced reasons). More specifically, various embodiments of the present disclosure relate to methods and systems for rendering audiovisual (A/V) simulation of a disaster situation by artificially simulating the disaster situation. Some people feel immune to disasters and fail to take precautions and do not partake in disaster education or preparation. However, in the event of an unforeseen disaster situation, proper knowledge of the steps to take in responding to the disaster situation can be save lives. In many situations, the environment dictates how to respond to the disaster situation.

Methods and systems disclosed herein can educate users on how to respond to a disaster via a virtual reality environment. In an example, the disclosed system, via a virtual reality environment, teaches users how to respond if an earthquake hits the user's locality.

In some embodiments, the disaster simulation is created by an electronic disaster situation rendering program that renders a disaster situation. A user can choose to render a simulation of a disaster situation out of several available disaster situations (e.g., fire, earthquake, flood, tornado, hurricane). A user can download (e.g., using a mobile phone) such a program from a remote server and install the program on a dedicated virtual reality console or a programmable virtual reality device such as a headset.

Methods and systems disclosed herein integrate a user's environment into the virtual reality disaster situation by creating a three-dimensional (3D) model of the user's environment. Thus, a simulation model of the fire specifically at the user's home can be created. Such a simulation model can include the interior and/or exterior details of the user's home (e.g., positions of furniture in the user's home, positions of objects, drawings, and sculptures in the user's home). According to embodiments disclosed herein, a user can be immersed in the simulation model using a virtual reality device such as a virtual reality headset. In other embodiments, the simulation can be projected onto a structural element such as a wall or a floor in the user's home. According to aspects disclosed herein, the system can provide audio-visual indicators (e.g., in the form of avatars, virtual teachers, virtual users, machine-generated voice, etc.) that include tips or information on how to respond during a disaster. For example, Smokey The Bear can appear as an NV indicator and inform kids what to do in the event of a fire in the house. In some embodiments, the tips or information are provided after the exercise is complete and the user's actions are evaluated.

In some embodiments, the disclosed system can continuously monitor and collect data relating to the user's reactions during the simulation model. Upon monitoring the user, the system can analyze the user's reactions to the simulation model. For example, if the collected data indicates that a user reacts by rushing out the door of a room in a manner that can cause an overhead painting hanging on the door to injure the user's head, then a virtual avatar in the simulation model can recommend the user to remove the painting from that location.

In some embodiments, the system generates a report based on the user's reactions. This report can, for example, be viewed by a user or shared with relevant third parties such as insurance companies, law enforcement officials or public officials handling disaster responsiveness. In some embodiments, the disclosed system can activate a disaster handling item by communicating a signal. For example, the system can send a signal to an evacuation bag that is on the exit path for a user in the event of a fire. The disaster handling item, in some examples, can be coupled to a receiving device that receives the activation signal. Various types of disaster handling items can be integrated with the disclosed system. Examples include an emergency survival kit, an evacuation bag, a fire extinguisher, an emergency response kit, a flashlight, a battery-powered radio, a first aid kit, a cellular phone, and a map.

To create the 3D model, the system can receive images of an environment associated with a facility (e.g., a building, a school, a residence, a retirement home, a hospital, a rescue shelter, a high-rise building, a store, a mall, a restaurant, an office, a factory, a stadium, a movie theater). The images can be photographic information, or they can be audio-visual information such as videos. In some embodiments, the images can be captured by a camera coupled to the disclosed system. For example, a camera can scan a room and capture images of the room, including the location of the walls, doors, windows, exits, bathrooms, furniture in the room, painting or sculptures in the room, objects scattered on the floor, knives or other objects located on the counter or tables/desks.

In some embodiments, the simulation model can be customized based on one or more factors. Examples of such factors can be the age of the user, a skillset of the user, a geographical location of the facility (i.e., whether the building is located in an earthquake-prone zone), or a location of the facility with respect to law enforcement officials or public officials handling disaster responsiveness. In some embodiments, images can be captured by overhead low-altitude drones, which can transmit the images to the disclosed system. The images received by the disclosed system can correspond to the interior environment and/or exterior environment of the facility.

In some embodiments, the 3D model of the facility (or the simulation model of the disaster situation or the reactions of the users) can be communicated to a third party for evaluation of a measure of preparedness of the facility to the disaster situation. In some embodiments, the third party can provide a certification indicating the measure of preparedness of the facility to the disaster situation. In some scenarios, an insurance provider can offer discounts on insurance premiums for a facility based on the certification or the measure of preparedness of the facility to the disaster situation. In some examples, a school or an entire community can be certified. In some embodiments, users and individuals can be trained on how to respond to a disaster situation at a facility based on the certification. This is beneficial as it will enable a user or an individual to have knowledge specific to the environment at the facility and for a certain disaster situation.

As used herein, the term "user" is synonymously with any person or individual. In the following description, for the purposes of explanation, numerous specific details are set forth in order to provide a thorough understanding of embodiments of the present disclosure. However, it will be apparent on reading the disclosure to one skilled in the art that embodiments may be practiced without some of these specific details.

Moreover, the techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions that may be used to program a computer (or other electronic devices) to perform a process. The machine-readable medium may include, but is not limited to, floppy diskettes, optical discs, compact disc read-only memories (CD-ROMs), magneto-optical disks, ROMs, random-access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

FIG. 1 illustrates an example of a network-based operating environment 100 in which some embodiments of the present disclosure may be used. As illustrated in FIG. 1, operating environment 100 may include applications 105A-105N running on one or more computing devices 110A-110M (such as a mobile device; a mobile phone; a telephone; a tablet computer; a mobile media device; a mobile gaming device; a vehicle-based computer; a dedicated terminal; a public terminal, desktop, or laptop computer; a kiosk; wearable devices such as a smartwatch; etc.). In some embodiments, applications 105A-105N may be stored on one or more computing devices 110A-110M or may be stored remotely on a server (in the "cloud"). These computing devices can include mechanisms for receiving and sending traffic by connecting through network 115 to virtual reality platform 120, receiving device 145, and data stores 125 and 130.

FIG. 1 also shows virtual reality device 135 connected via network 115 to virtual reality platform 120. Virtual reality device 135 can be a dedicated virtual reality console, or a programmable virtual reality device such as a headset. Virtual reality platform 120 and/or virtual reality device 135 can receive requests for rendering simulations of disaster situations. These requests can be sent by one or more computing devices 110A-110M running applications 105A-105N. For example, a mobile application can request a certain type of catastrophe be simulated at a particular facility, and such a request can be communicated to virtual reality device 135 and/or virtual reality platform 120. In some embodiments, a remote server communicates directly with virtual reality platform 120 and/or virtual reality device 135 to provide information, images, and/or instructions.

Virtual reality platform 120 can receive images of the environment of a facility. In some embodiments, virtual reality platform 120 can send a signal to a receiving device 145 that is attached to a disaster handling item or receiving device. Examples of a receiving device or disaster handling item includes an emergency survival kit, an evacuation bag, a fire extinguisher, an emergency response kit, a flashlight, a battery-powered radio, a first aid kit, a cellular phone, and a map. The signal can cause the disaster handling item to beep, glow, or otherwise provide an indication to the user to take the disaster handling item.

In some embodiments, virtual reality platform 120 communicates a 3D model of the facility to a third party 150 for evaluation of a measure of preparedness of the facility to the disaster situation. In some scenarios, third party 150 can provide a certification indicating the measure of preparedness of the facility to the disaster situation. In some scenarios, an insurance provider can offer discounts on insurance premiums for a facility based on the certification or the measure of preparedness of the facility to the disaster situation.

Computing devices 110A-110M may be configured to communicate via the network 115 with virtual reality platform 120. In some embodiments, computing devices 110A-110M can retrieve or submit information virtual reality platform 120 and run one or more applications 105A-105N with customized content retrieved by virtual reality platform 120 and data stores 125 and 130. For example, computing devices 110A-110M can execute a browser application or a customized client to enable interaction between the computing devices 110A-110M, virtual reality platform 120, and data stores 125 and 130. In some embodiments, virtual reality platform 120 can be a server.

Network 115 can be any combination of local area and/or wide area networks, using wired and/or wireless communication systems. Network 115 can be or could use any or more protocols/technologies: Ethernet, IEEE 802.11 or Wi- Fi, worldwide interoperability for microwave access (WiMAX), cellular telecommunication (e.g., 3G, 4G, 5G), CDMA, cable, digital subscriber line (DSL), etc. Similarly, the networking protocols used on network 115 may include multiprotocol label switching (MPLS), transmission control protocol/Internet protocol (TCP/IP), User Datagram Protocol (UDP), hypertext transport protocol (HTTP), simple mail transfer protocol (SMTP) and file transfer protocol (FTP). Data exchanged over network 115 may be represented using technologies, languages, and/or formats including hypertext markup language (HTML) or extensible markup language (XML). In addition, all or some links can be encrypted using conventional encryption technologies such as secure sockets layer (SSL), transport layer security (TLS), and Internet Protocol security (IPsec).

Data stores 125 and 130 can be used to manage storage and access to user data such as user profiles, 3D models of the interior and/or exterior of a facility, disaster situations, image information of the environment (e.g., interior and/or exterior) of a facility, a log of users' reactions to a simulation model, analysis of users' reactions, and other information. Data stores 125 and 130 may be a data repository of a set of integrated objects that are modeled using classes defined in database schemas. Data stores 125 and 130 may further include flat files that can store data. Virtual reality platform 120 and/or other servers may collect and/or access data from the data stores 125 and 130. Information provided by users can be stored in data stores 125 and 130.

Figure 2:
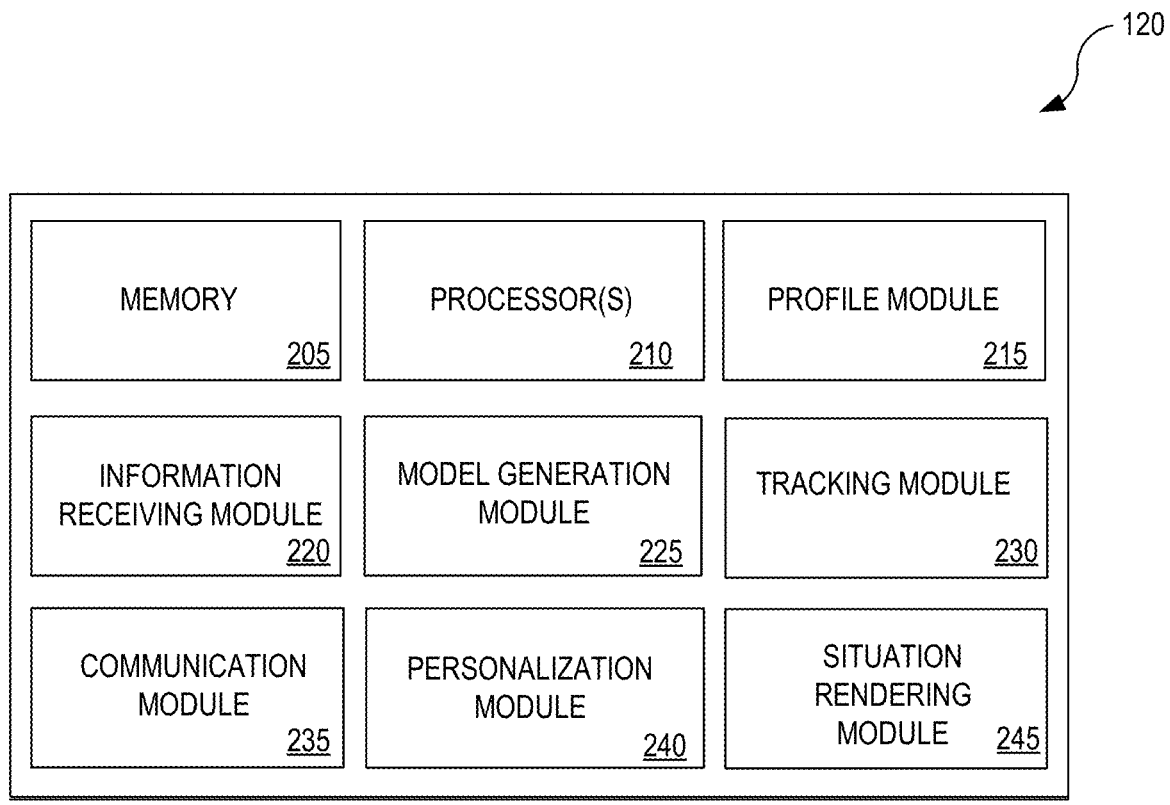
FIG. 2 illustrates various components of a virtual reality platform that may be used in accordance with various embodiments of the present disclosure.

FIG. 2 illustrates a set of components within virtual reality platform 120 according to one or more embodiments of the present disclosure. In some embodiments, these components can be included inside a virtual reality device 135. According to the embodiments shown in FIG. 2, virtual reality platform 120 can include memory 205, one or more processors 210, profile module 215, information receiving module 220, model generation module 225, tracking module 230, communication module 235, personalization module 240, and situation rendering module 245. Other embodiments of the present invention may include some, all, or none of these modules and components along with other modules, applications, and/or components. Still yet, some embodiments may incorporate two or more of these modules and components into a single module and/or associate a portion of the functionality of one or more of these modules with a different module.

Memory 205 can store instructions for running one or more applications or modules on processor(s) 210. For example, memory 205 could be used in one or more embodiments to house all or some of the instructions needed to execute the functionality of profile module 215, information receiving module 220, model generation module 225, tracking module 230, communication module 235, personalization module 240, and situation rendering module 245. Generally, memory 205 can include any device, mechanism, or populated data structure used for storing information. In accordance with some embodiments of the present disclosure, memory 205 can encompass, but is not limited to, any type of volatile memory, non-volatile memory, and dynamic memory. For example, memory 205 can be random-access memory, memory storage devices, optical memory devices, magnetic media, floppy disks, magnetic tapes, hard drives, SIMMs, SDRAM, DIMMs, RDRAM, DDR RAM, SODIMMS, EPROMs, EEPROMs, compact discs, DVDs, and/or the like. In accordance with some embodiments, memory 205 may include one or more disk drives, flash drives, one or more databases, one or more tables, one or more files, local cache memories, processor cache memories, relational databases, flat databases, and/or the like. In addition, those of ordinary skill in the art will appreciate many additional devices and techniques for storing information that can be used as memory 205.

Profile module 215 can create profiles for users of virtual reality platform 120 that reflect personal information of the users. Personal data of a user or a parent can include a name, an address, an age, a phone number, an email, bank account numbers, names and ages of children, and a photograph of the user. Profiles may include whether the user has undergone disaster situation training, and if so, data relating to the user's reactions. Profiles can also include a 3D model of an environment associated with a user such as the user's home, work, school, or apartment. Profile module 215 can query a networked database to retrieve profile information of users. Such profile information can be stored in the "cloud" or physically coupled to profile module 215.

Information receiving module 220 can receive images of an indoor and/or outdoor environment of a facility. In some embodiments, the images can be captured by a camera coupled to the disclosed virtual reality platform 120. For example, a camera can scan a room and capture images of the room, including the location of the walls, doors, windows, exits, bathrooms, furniture in the room, painting or sculptures in the room, objects scattered on the floor, knives or other objects located on the counter or tables/desks, yard, street, nearby buildings, and fire hydrants. In some embodiments, images can be captured by overhead low-altitude drones, which can transmit the images to the disclosed system. The images can be provided to model generation module 225.

Model generation module 225 facilitates creation of 3D models of an environment associated with a facility based on the images captured by information receiving module 220. Model generation module 225 can also create disaster situation models. For example, situations such as earthquakes, floods, or fires can be modeled. Users are immersed in a disaster situation based on a simulation model of a disaster situation. Certain disasters simulations may be suggested based on where the facility is located. For example, homes in coastal areas may be more prone to flooding and thus flood simulations may be encouraged. Certain simulations can be used to lower insurance rates of insured property located in certain areas.

Tracking module 230 is capable of tracking users' reactions to a disaster situation. The tracking can be performed by a camera or any scanning device. Tracking module 230 can continuously collect data relating to users' reactions by monitoring the users. For example, while simulating a fire in a user's home, tracking module 230 can monitor the user's reaction time, the user's route to exit the building, the user's strategy for helping others, and the health data of the user (e.g., heartrate, temperature). Such data can be analyzed. During or after the simulation, tips, points, or pointers can appear (e.g., in bubbles) so that the user can learn from the simulation.

Communication module 235 facilitates communication with computing devices. For example, communication module 235 allows a user to download a disaster situation from a remote server. In some embodiments, communication module 235 communicates with a user's device (e.g., mobile phone) to download an electronic disaster situation rendering program corresponding to a disaster situation. In some embodiments, communication module 235 communicates the 3D model to a third party for evaluation of a measure of preparedness of the facility and/or the user to the disaster situation. In some embodiments, the third party provides a certification indicating the measure of preparedness of the facility and/or the user to the disaster situation. In some embodiments, communication module 235 sends a signal to a receiving device (e.g., emergency kit, flashlight) to indicate to the user that the user should take the receiving device.

Personalization module 240 facilitates customization of a disaster situation and feedback to the user's performance during the simulation based on one or more factors. Examples of the factors can be an age of the user, a skillset of the user, a geographical location of the facility, and/or a location of the facility with respect to law enforcement officials or public officials handling disaster responsiveness.

Situation rendering module 245 renders simulations of disaster situations. The disaster situation can be rendered on a structural element of the facility such as a wall or a floor. In some embodiments, the disaster situation is rendered on a display screen coupled to a virtual reality device (e.g., a headset).

Figure 3:
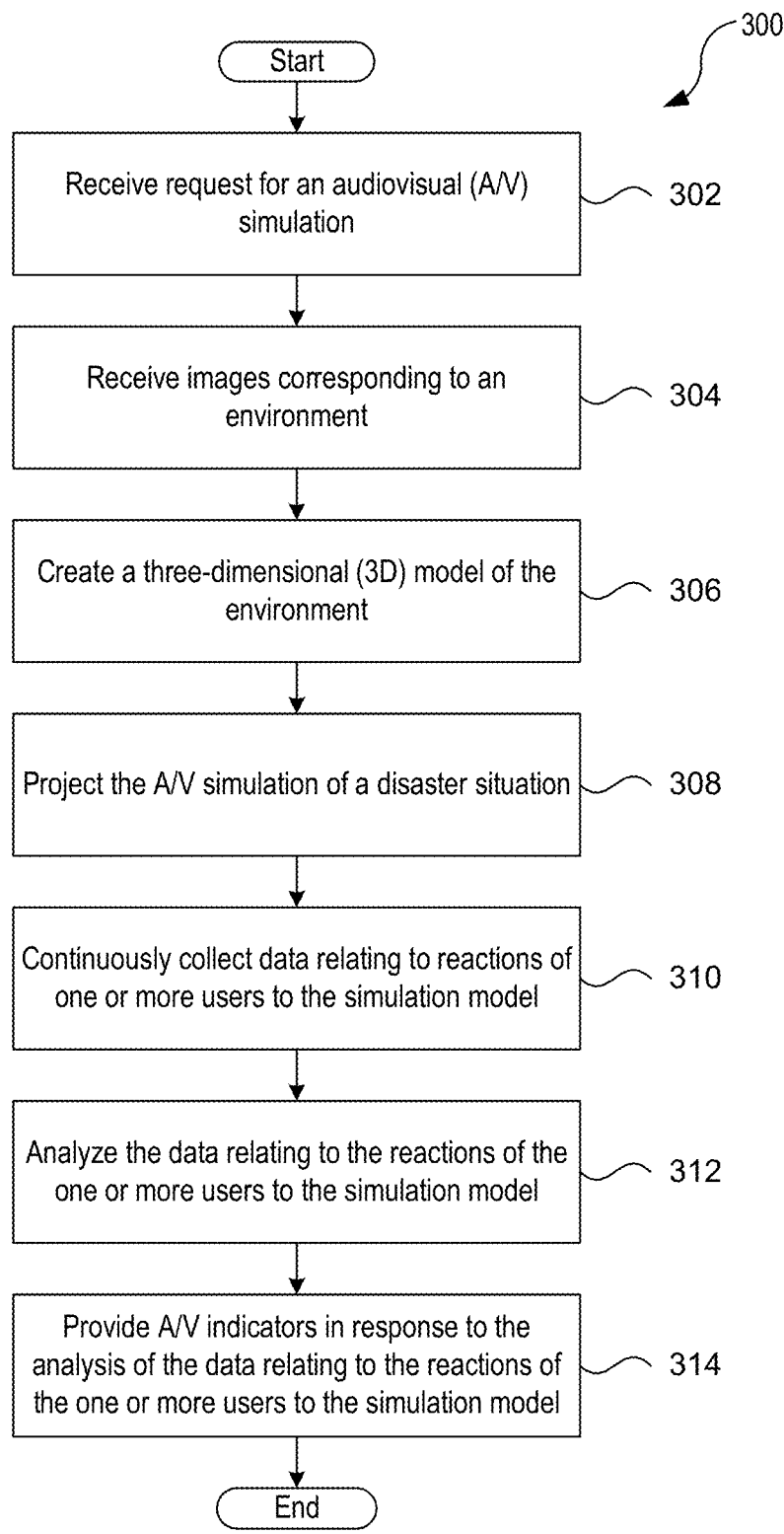
FIG. 3 is a flowchart illustrating a set of operations for creation of virtual reality environments in accordance with various embodiments of the present disclosure.
Figure 4:
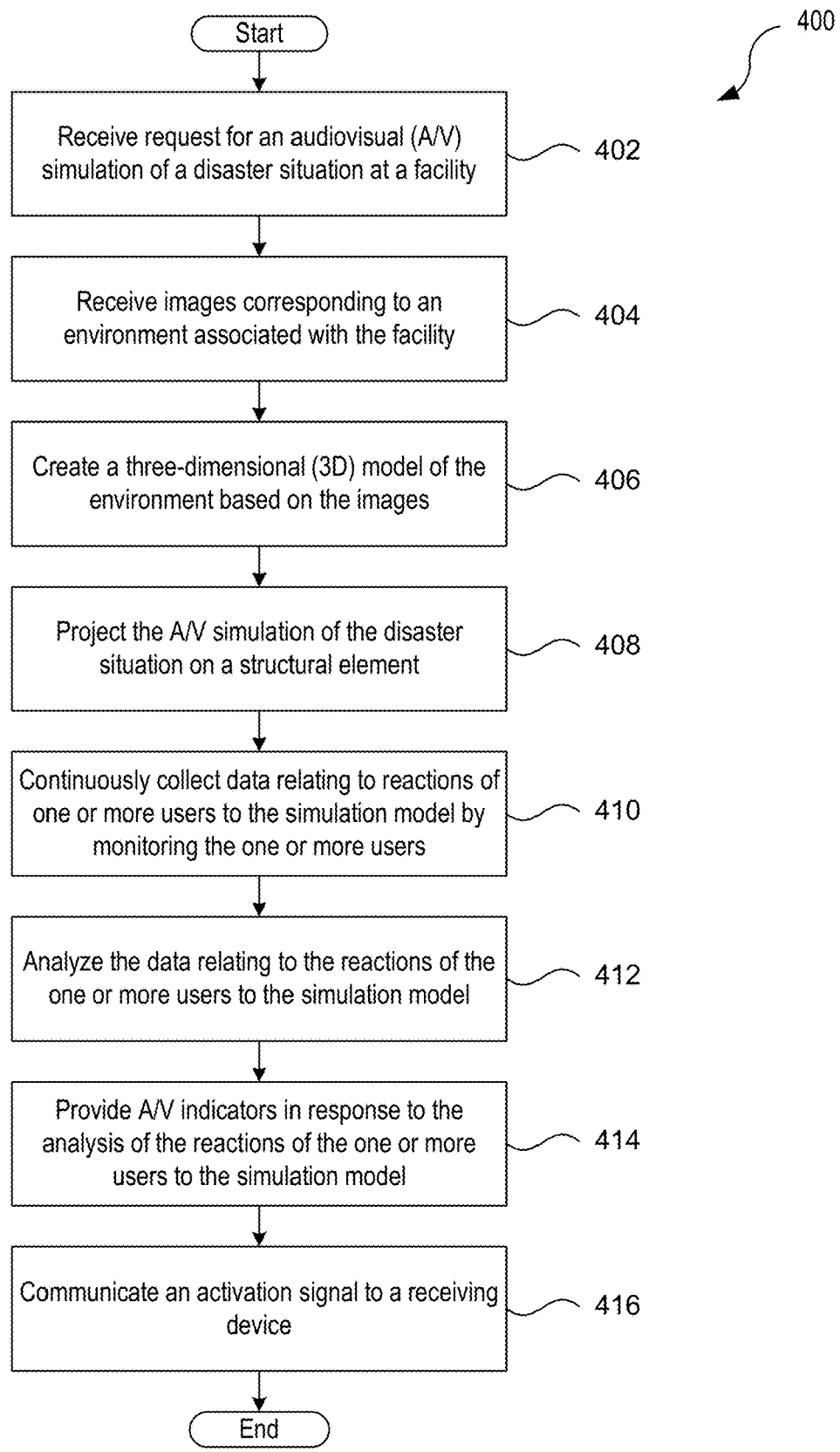
FIG. 4 is a flowchart illustrating a set of operations for creation of virtual reality environments in accordance with various embodiments of the disclosure.

FIGS. 3-4 are flowcharts illustrating sets of operations for creating a virtual reality environment for catastrophe preparedness. In some embodiments, fewer than all of the operations in each set of operations are performed, whereas in other embodiments additional operations are performed. Moreover, in some embodiments, the operations may be performed in different orders or in parallel. The operations can be performed by various components of virtual reality platform 120 illustrated in FIG. 2.

FIG. 3 is a flowchart illustrating a set of operations 300 for rendering disaster situations in accordance with various embodiments of the disclosure. In some embodiments, the set of operations 300 can be performed by a virtual reality device (e.g., virtual reality headset, virtual reality platform). Receive operation 302 receives a request (e.g., from a user) for rendering an A/V simulation of a disaster situation at a facility. Receive operation 304 receives images corresponding to an environment associated with the facility. In some embodiments receive operation 304 collects the images via a camera or a video camera.

Create operation 306 creates a 3D model of the environment associated with a facility based on the received images. Create operation 306 further provides an NV simulation according to the 3D model created. The simulation can be customized based on one or more factors. Examples of factors can include an age of the one or more users, a skillset of the one or more users, a geographical location of the facility, the user's response during the simulation, or a location of the facility with respect to law enforcement officials or public officials handling disaster responsiveness. Project operation 308 projects the AN simulation of the disaster situation on a structural element. Thus, the disaster situation/simulation model includes a 3D model of the facility. Examples of structural elements can include a wall, a floor, a balcony, a room, a kitchen, a garden, a classroom, a porch, a portico, a ceiling, an attic, a window, a door, a vent, a seat, a rooftop, and a bench.

Collection operation 310 continuously collects data relating to reactions of one or more users to the simulation model by monitoring the one or more users. Analyze operation 312 analyzes the data relating to the reactions of the one or more users to the simulation model. Provide operation 314 provides NV indicators in response to the analysis of the data relating to the reactions of the one or more users to the simulation model. The process terminates thereafter.

FIG. 4 is a flowchart illustrating a set of operations 400 for rendering simulations of disaster situations in accordance with various embodiments of the disclosure. In some embodiments, the set of operations 400 can be performed by a virtual reality device. Operations 402-414 are similar to the operations 302-314.

In some embodiments, virtual reality platform 120 activates a disaster handling unit (e.g., located external to virtual reality platform 120) associated with a disaster situation. Thus, in such embodiments, communicate operation 416 communicates an activation signal to a receiving device, based on analyzing the reactions of the users. For example, the system can send a signal to an evacuation bag that is on the exit path for a user, in the event of an earthquake situation. The disaster handling item can, in some examples, be coupled to a receiving device that receives the activation signal. Various types of disaster handling items can be integrated with the disclosed system. Examples, without limitation can be an emergency survival kit, an evacuation bag, a fire extinguisher, an emergency response kit, a flashlight, a battery-powered radio, a first aid kit, a cellular phone, and a map. The process terminates thereafter.

Computer System Overview

Figure 5:
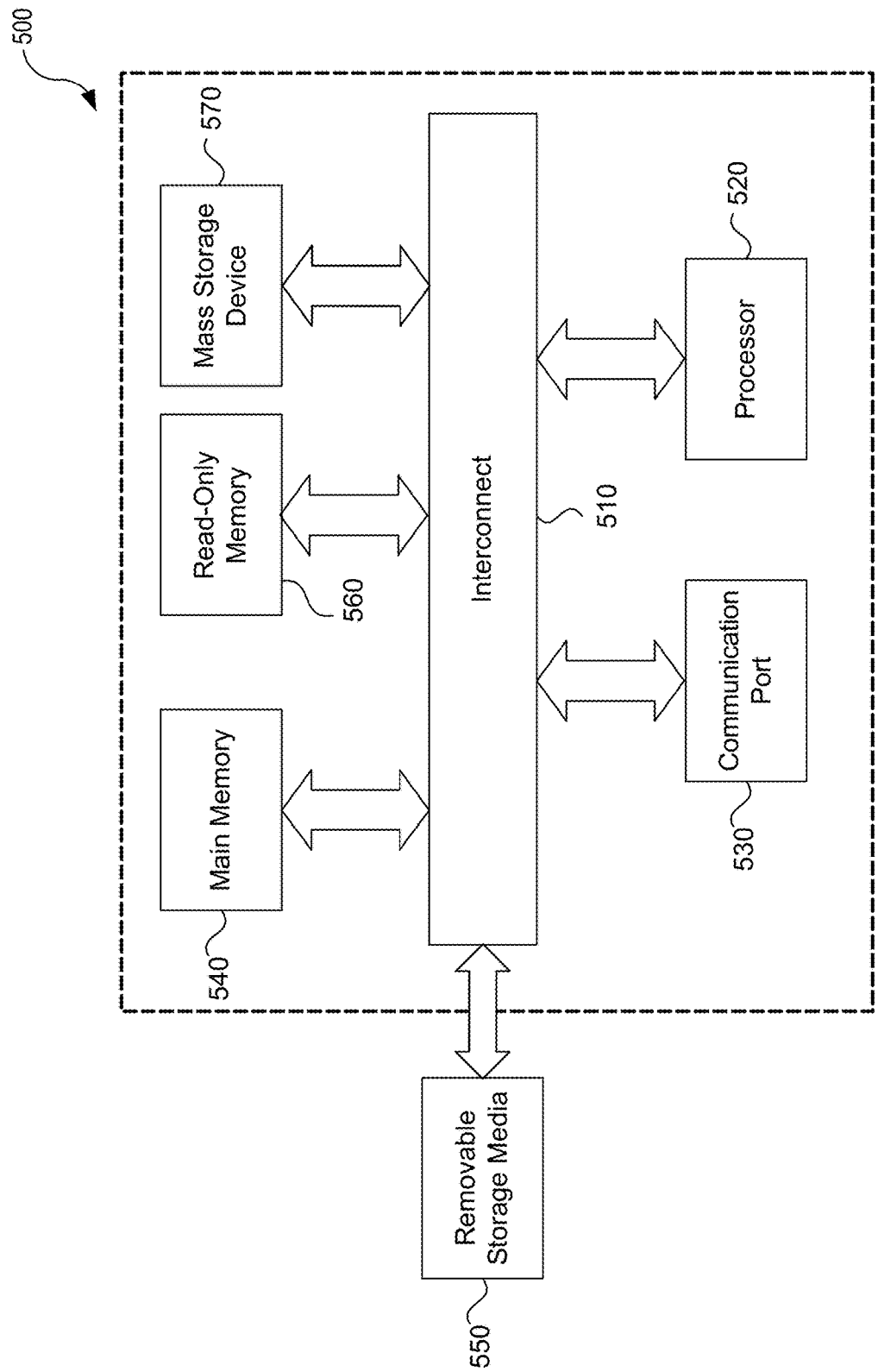
FIG. 5 illustrates an example of a computer system with which some embodiments of the present disclosure may be utilized.

Embodiments of the present disclosure include various steps and operations, which have been described above. A variety of these steps and operations may be performed by hardware components or may be embodied in machine-executable instructions, which may be used to cause a general-purpose or special-purpose processor programmed with the instructions to perform the steps. Alternatively, the steps may be performed by a combination of hardware, software, and/or firmware. As such, FIG. 5 is an example of a computer system 500 with which embodiments of the present disclosure may be utilized. According to the present example, the computer system includes an interconnect 510, at least one processor 520, at least one communication port 530, a main memory 540, a removable storage media 550, a read-only memory 560, and a mass storage device 570.

Processor(s) 520 can be any known processor, such as, but not limited to, an Intel® Itanium® or Itanium 2® processor(s), or AMD® Opteron® or Athlon MP®processor(s), or Motorola® lines of processors. Communication port(s) 530 can be any of an RS-232 port for use with a modem-based dialup connection, a 10/100 Ethernet port, or a Gigabit port using copper or fiber. Communication port(s) 530 may be chosen depending on a network such a local area network (LAN), wide area network (WAN), or any network to which the computer system 500 connects.

Main memory 540 can be random-access memory (RAM) or any other dynamic storage device(s) commonly known in the art. Read-only memory 560 can be any static storage device(s) such as programmable read-only memory (PROM) chips for storing static information, such as instructions for processor 520.

Mass storage device 570 can be used to store information and instructions. For example, hard disks such as the Adaptec® family of SCSI drives, an optical disc, an array of disks such as RAID, the Adaptec family of RAID drives, or any other mass storage devices may be used.

Interconnect 510 communicatively couples processor(s) 520 with the other memory, storage, and communication blocks. Interconnect 510 can be a PCI/PCI-X- or SCSI-based system bus, depending on the storage devices used.

Removable storage media 550 can be any kind of external hard-drives, floppy drives, IOMEGA® Zip Drives, Compact Disc Read-Only Memory (CD-ROM), Compact Disc Re-Writable (CD-RW), Digital Video Disc-Read-Only Memory (DVD-ROM).

The components described above are meant to exemplify some types of possibilities. In no way should the aforementioned examples limit the disclosure, as they are only exemplary embodiments.

Terminology

Brief definitions of terms, abbreviations, and phrases used throughout this application and the appendices are given below.

The terms "connected" or "coupled" and related terms are used in an operational sense and are not necessarily limited to a direct physical connection or coupling. Thus, for example, two devices may be coupled directly or via one or more intermediary media or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

The phrases "in some embodiments," "according to some embodiments," "in the embodiments shown," "in other embodiments," "embodiments," and the like generally mean that the particular feature, structure, or characteristic following the phrase is included in at least one embodiment of the present disclosure and may be included in more than one embodiment of the present disclosure. In addition, such phrases do not necessarily refer to the same embodiments or to different embodiments.

If the specification states a component or feature "may," "can," "could," or "might" be included or have a characteristic, that particular component or feature is not required to be included or have the characteristic.

The term "responsive" includes completely or partially responsive.

The term "module" refers broadly to a software, hardware, or firmware (or any combination thereof) component. Modules are typically functional components that can generate useful data or other output using specified input(s). A module may or may not be self-contained. An application program (also called an "application") may include one or more modules, or a module can include one or more application programs.

The term "network" generally refers to a group of interconnected devices capable of exchanging information. A network may be as few as several personal computers on a local area network (LAN) or as large as the Internet, a worldwide network of computers. As used herein, "network" is intended to encompass any network capable of transmitting information from one entity to another. In some cases, a network may be comprised of multiple networks, even multiple heterogeneous networks, such as one or more border networks, voice networks, broadband networks, financial networks, service provider networks, Internet Service Provider (ISP) networks, and/or Public Switched Telephone Networks (PSTNs) interconnected via gateways operable to facilitate communications between and among the various networks.

Also, for the sake of illustration, various embodiments of the present disclosure have herein been described in the context of computer programs, physical components, and logical interactions within modern computer networks. Importantly, while these embodiments describe various embodiments of the present disclosure in relation to modern computer networks and programs, the method and apparatus described herein are equally applicable to other systems, devices, and networks, as one skilled in the art will appreciate. As such, the illustrated applications of the embodiments of the present disclosure are not meant to be limiting, but instead are examples. Other systems, devices, and networks to which embodiments of the present disclosure are applicable include, but are not limited to, other types of communication and computer devices and systems. More specifically, embodiments are applicable to communication systems, services, and devices such as cell phone networks and compatible devices. In addition, embodiments are applicable to all levels of computing, from the personal computer to large network mainframes and servers.

In conclusion, the present disclosure discloses novel systems, methods, and arrangements for generating a virtual reality environment for catastrophe preparedness and response education. While detailed descriptions of one or more embodiments of the disclosure have been given above, various alternatives, modifications, and equivalents will be apparent to those skilled in the art without varying from the spirit of the disclosure. For example, while the embodiments described above refer to particular features, the scope of this disclosure also includes embodiments having different combinations of features and embodiments that do not include all of the described features. Accordingly, the scope of the present disclosure is intended to embrace all such alternatives, modifications, and variations as fall within the scope of the claims, together with all equivalents thereof. Therefore, the above description should not be taken as limiting.

What is claimed is:

1. A computer-implemented method for evaluating user responses to a simulated disaster situation, the computer-implemented method comprising:

receiving visual content and instructions associated with an audiovisual (A/V) simulation of a disaster situation;

creating, by a model generation module, a three-dimensional (3D) model of an environment associated with a user;

projecting an immersive simulation, by a virtual reality device, the immersive simulation defined according to the 3D model of the environment and the visual content associated with the A/V simulation of the disaster situation, the virtual reality device configured to be worn by the user;

customizing the immersive simulation based at least in part on an age of the user who is wearing the virtual reality device;

analyzing data relating to reactions of the user to the immersive simulation collected while the user was interacting with the immersive simulation;

providing feedback., to the user during the immersive simulation, which includes:

A/V indicators in response to the analysis of the data relating to the reactions of the user to the immersive simulation, wherein the analyzing the data includes generating and providing results, as the A/V indicators, during the immersive simulation as tips, points, or pointers that appear in the immersive simulation, by A) identifying a reconfiguration for the environment associated with the user and/or B) determining feedback customized based on the age of the user; and determining a measure of preparedness for the disaster situation based at least in part on the A/V simulation and the reactions of the user.

2. The method of claim 1, wherein the A/V indicators include at least one of an avatar, a virtual teacher, a virtual user, or a machine-generated voice.

3. The method of claim 1, wherein the 3D model is automatically generated based on one or more images that correspond to images of an interior environment of a facility or images of an exterior environment of the facility.

4. The method of claim 3, wherein the one or more images are captured by a camera coupled to the virtual reality device.

5. The method of claim 1, wherein the data relating to reactions of the user are collected with a camera or scanning device.

6. The method of claim 1, further comprising:
generating a report based on analyzing the data relating to the reactions of the user to the immersive simulation.

7. The method of claim 1, wherein customizing the immersive simulation is further based on a skillset of the user or a geographical location of the environment.

8. The method of claim 1, wherein the environment is specified as at least the following: a building, a school, a residence, a retirement home, a hospital, a rescue shelter, a high-rise building, a store, a mall, a restaurant, an office, a factory, a stadium, or a movie theater.

9. The method of claim 1, further comprising:
communicating the 3D model to a third party for evaluation of the measure of preparedness to the disaster situation; and
receiving, from the third party, a certification indicating the measure of preparedness to the disaster situation.

10. The method of claim 1, further comprising:
sending a signal to a receiving device coupled to a disaster handling item to indicate to the user to take the disaster handling item with them.

11. A computing system for evaluating user responses to a simulated disaster situation, the computing system comprising:
one or more processors; and
one or more memories storing instructions that, when executed by the one or more processors, cause the computing system to perform a process comprising:
receiving visual content and instructions associated with an audiovisual (A/V) simulation of a disaster situation;
creating, by a model generation module, a three-dimensional (3D) model of an environment associated with a user;
projecting an immersive simulation, by a virtual reality device, the immersive simulation defined according to the 3D model of the environment and the visual content associated with the A/V simulation of the disaster situation, the virtual reality device configured to be worn by the user;
customizing the immersive simulation based at least in part on an age of the user who is wearing the virtual reality device;
analyzing data relating to reactions of the user to the immersive simulation collected while the user was interacting with the immersive simulation;
providing feedback to the user during the immersive simulation, which includes:
A/V indicators in response to the analysis of the data relating to the reactions of the user to the immersive simulation,
wherein the analyzing the data includes generating and providing results, as the A/V indicators, during the immersive simulation as tips, points, or pointers that appear in the immersive simulation, by A) identifying a reconfiguration for the environment associated with the user and/or B)
determining feedback customized based on the age of the user; and
determining a measure of preparedness for the disaster situation based at least in part on the A/V simulation and the reactions of the user.

12. The computing system of claim 11, wherein the A/V indicators include at least one of an avatar, a virtual teacher, a virtual user, or a machine-generated voice.

13. The computing system of claim 11, wherein the 3D model is automatically generated based on one or more images that correspond to images of an interior environment of a facility or images of an exterior environment of the facility.

14. The computing system of claim 13, wherein the one or more images are captured by a camera coupled to the virtual reality device.

15. The computing system of claim 11, wherein the data relating to reactions of the user are collected with a camera or scanning device.

16. A non-transitory computer-readable storage medium storing instructions that, when executed by a computing system, cause the computing system to perform a process comprising:
receiving visual content and instructions associated with an audiovisual (A/V) simulation of a disaster situation;
creating, by a model generation module, a three-dimensional (3D) model of an environment associated with a user;
projecting an immersive simulation, by a virtual reality device, the immersive simulation defined according to the 3D model of the environment and the visual content associated with the A/V simulation of the disaster situation, the virtual reality device configured to be worn by the user;
customizing the immersive simulation based at least in part on an age of the user who is wearing the virtual reality device;
analyzing data relating to reactions of the user to the immersive simulation collected while the user was interacting with the immersive simulation;
providing feedback, to the user during the immersive simulation, which includes:
providing A/V indicators in response to the analysis of the data relating to the reactions of the user to the immersive simulation,
wherein the analyzing the data includes generating and providing results, as the A/V indicators, during the immersive simulation as tips, points, or pointers that appear in the immersive simulation, by A) identifying a reconfiguration for the environment associated with the user and/or B) determining feedback customized based on the age of the user; and
determining a measure of preparedness for the disaster situation based at least in part on the A/V simulation and the reactions of the user.

17. The non-transitory computer-readable storage medium of claim 16, wherein the A/V indicators include at least one of an avatar, a virtual teacher, a virtual user, or a machine-generated voice.

18. The non-transitory computer-readable storage medium of claim 16, wherein the 3D model is automatically generated based on one or more images that correspond to images of an interior environment of a facility or images of an exterior environment of the facility.

19. The non-transitory computer-readable storage medium of claim 18, wherein the one or more images are captured by a camera coupled to the virtual reality device.

20. The non-transitory computer-readable storage medium of claim 16, wherein the data relating to reactions of the user are collected with a camera or scanning device.

\* \* \* \* \*